(12) United States Patent
Rehnelt et al.

(10) Patent No.: US 6,424,535 B1
(45) Date of Patent: Jul. 23, 2002

(54) HYBRID CIRCUIT WITH CONTACT SURFACES (SOLDER PADS)

(75) Inventors: Karl Rehnelt, Munich; Frank Templin, Berlin, both of (DE)

(73) Assignee: Tyco Electronics Logistics AG (CH)

( * ) Notice: Subject to any disclaimer, the term of this patent is extended or adjusted under 35 U.S.C. 154(b) by 0 days.

(21) Appl. No.: 09/647,484

(22) PCT Filed: Mar. 16, 1999

(86) PCT No.: PCT/DE99/00736

§ 371 (c)(1),
(2), (4) Date: Sep. 29, 2000

(87) PCT Pub. No.: WO99/51070

PCT Pub. Date: Oct. 7, 1999

(30) Foreign Application Priority Data

Mar. 31, 1999 (DE) ......................................... 198 14 429

(51) Int. Cl.$^7$ ................................................. H05K 1/11
(52) U.S. Cl. ........................ 361/748; 361/743; 361/784; 174/250; 174/262; 174/263
(58) Field of Search ................................ 361/743, 748, 361/767, 771, 772–774, 784, 803, 807, 808; 174/250, 253, 256, 257, 262, 263, 267; 257/690, 697, 700, 701, 703, 723, 724, 734, 779; 439/83, 876, 942, 951; 29/827, 843, 860; 228/179.1, 180.1, 180.21; 438/106, 125, 612

(56) References Cited

U.S. PATENT DOCUMENTS

| | | | | |
|---|---|---|---|---|
| 4,554,575 A | * | 11/1985 | Lucas | ......................... 174/263 |
| 4,790,894 A | * | 12/1988 | Homma et al. | ........ 228/180.21 |
| 5,140,745 A | * | 8/1992 | McKenzie, Jr. | .............. 174/263 |
| 5,383,095 A | * | 1/1995 | Korsunsky et al. | ........... 439/65 |
| 6,183,301 B1 | * | 2/2001 | Paagman | .................... 439/876 |

FOREIGN PATENT DOCUMENTS

EP 0 148 461 A1 * 7/1985

* cited by examiner

*Primary Examiner*—David L. Talbott
*Assistant Examiner*—John B. Vigushin
(74) *Attorney, Agent, or Firm*—Baker & Daniels

(57) ABSTRACT

A plate-shaped ceramic circuit substrate (6), which is adapted to be vertically mounted on a mother board, has near a lower edge (7) thereof a series of contact areas (solder pads) (1) for contacting the circuit with terminals of the mother board. For improved solderability also in case of small contact area (1), these contact areas extend down as far as the lower edge (7), and there is provided one recess (2) each which constitutes a solder deposit (3) and which extends through the circuit substrate (6) and runs from the lower face side (5) of the circuit substrate (6) upwardly into the respective contact area (1).

1 Claim, 1 Drawing Sheet

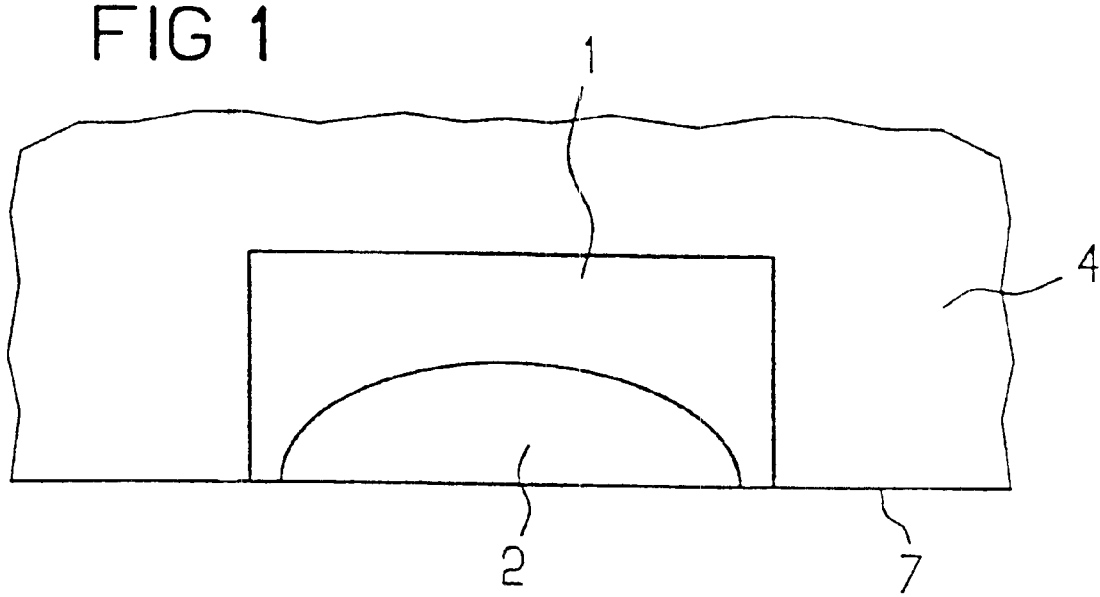
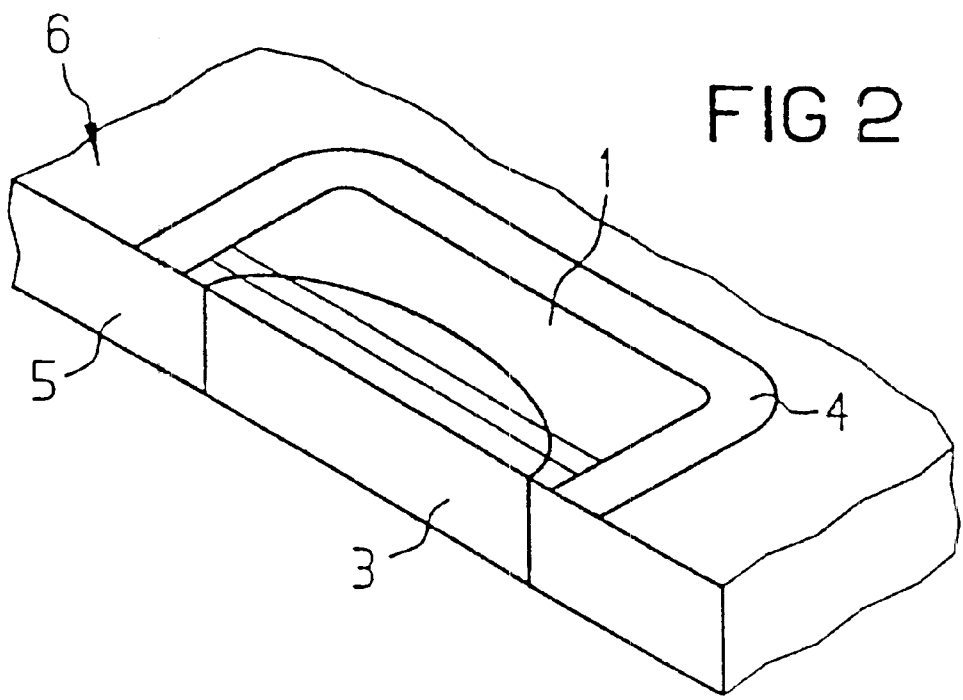

HYBRID CIRCUIT WITH CONTACT SURFACES (SOLDER PADS)

The invention relates to a hybrid circuit comprising a plate-shaped ceramic circuit substrate which can be vertically mounted on a mother board and on which is provided, near a lower edge, a series of contact areas (solder pads) for contacting the circuit with terminals of the mother board.

DESCRIPTION OF THE PRIOR ART

Mounting in particular of single-in-line hybrid assemblies on a mother board (substrate) still today is frequently carried out by through-mounting, even if the hybrid circuit proper or its surroundings on the mother board are otherwise designed in the known SMD technology. For establishing contact on the circuit board, the hybrid circuits are mostly provided with a so-called terminal comb that is slid onto the face side (i.e. onto the two lower edges of the circuit substrate). Said comb, towards the hybrid circuit, mostly consists of pocket-shaped terminals which, mostly on one side, abut a solder pad and are soldered to the same, cp. EP 0 148 461 B1, incorporated herein by reference. On the circuit board side, these terminals or terminal pins are formed, for example, with a V-shaped point for through-mounting.

In case of high pin density of the terminal comb, there are frequently problems arising because of too small pad dimensions and a too low amount of solder material available in connection therewith.

SUMMARY OF THE INVENTION

It is the object of the present invention to create relief in this respect, without the mounting operation being rendered more complex.

With a hybrid circuit of the type indicated at the out-set, this object is met in that the contact areas each extend down as far as the lower edge, and in that there is provided one recess each which forms a solder deposit and which extends through the circuit substrate and runs from the lower end face of the circuit substrate up into the respective contact area.

According to a development of the invention, elongate terminals can be provided, the one end thereof being adapted to be connected to a contact location of the mother board and the opposite end thereof being soldered to at least one contact area via a pocket-shaped terminal contour extending around the lower edges of the circuit substrate.

The invention will be elucidated in the following in particular by way of an embodiment shown in both drawing figures wherein

BRIEF DESCRIPTION OF THE DRAWINGS

FIG. 1 shows a side view of a circuit substrate comprising a solder pad and a solder deposit according to the principles of the present invention FIG. 2 shows a perspective plane view of the circuit substrate shown in FIG. 1.

DETAILED DESCRIPTION OF THE PREFERRED EMBODIMENTS

The quality of the solder connection to be established at the respective solder pad is dependent decisively on the amount of solder deposited there for connection of the solder pad and the terminal. The solder material to be made available usually is applied in the form of solder paste more or less over the entire area of the solder pad, for example, by screen printing. The amount of solder paste in total thus is limited on the one hand by the surface area of the solder pad, with respect to which there is a tendency of reducing the same in the light of high pin density, and on the other hand, in more fundamental manner, by the application in the form of a relative thin layer (approx. 100 wry) substantially in sheet-like manner, i.e. across the area thereof.

"Referring to FIG. 2, according to the invention, a part of the sheet-like solder material available on solder pad 1 is replaced by a three dimensional solder deposit 3 located within circuit substrate 6. The solder deposit 3 is located adjacent a recess 2 with both the recess 2 and the solder deposit 3 extending down as far as the lower edge 7 of the circuit substrate 6. In the preferred embodiment, the thickness of the circuit substrate 6 is approximately 1 mm.

Referring to both FIG. 1 and FIG. 2, in addition to not only providing a deposit space for the solder material via recess 2, the present invention also extends the solder pad 1 to the lower edge 7 of circuit substrate 6, such that when the solder deposit 3 has been melted sufficient solder material is made available between the contact location for the terminal combs in order to obtain a solder connection of high quality."

The invention can be realized in various modifications. The solder pads 1 may be formed on one side of circuit substrate 4, or also on opposite sides so that both arms of a contact terminal can be soldered to the respective opposite contact pads. Above the solder deposit 3, the solder pad 1 may also be provided with the known-per-se through-plated holes. The solder pads 1 may also be formed, for example, on one side with a solder deposit 3 according to the invention and on the opposite side across the entire area. The provision of additional solder material by way of solder deposit 3 is advantageous for most of the solder processes common nowadays in which solder pads and/or the terminal comb already have solder paste applied thereto previously, but also for the conventional dip-soldering process.

The penetration or bore through the material of the circuit substrate is effected, cf. FIG. 1, on the scribing track of the initially integrally produced circuits.

What is claimed is:

1. A hybrid circuit comprising a plate-shaped ceramic circuit substrate for vertically mounting on a mother board, the substrate having a lower edge with a series of contact areas for making connection with the mother board, each of the contact areas extending down to the lower edge, and each of the contact areas having one recess which is filled with a solder deposit that extends through the circuit substrate from a lower end face of the circuit substrate up into the respective contact area, the hybrid circuit further comprising elongate terminals having one end thereof connected to a contact location of the mother board and an opposite end thereof soldered to one of the contact areas via a pocket shaped terminal contour extending around the lower edge of the circuit substrate.

* * * * *